(12) United States Patent
Hoshino (10) Patent No.: US 9,130,646 B2
(45) Date of Patent: Sep. 8, 2015

(54) SIGNAL GENERATING DEVICE AND RADIO DEVICE

(71) Applicant: KABUSHIKI KAISHA TOSHIBA, Minato-ku, Tokyo (JP)

(72) Inventor: Hiroaki Hoshino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/034,868

(22) Filed: Sep. 24, 2013

(65) Prior Publication Data

US 2014/0093011 A1    Apr. 3, 2014

(30) Foreign Application Priority Data

Oct. 1, 2012   (JP) .................. 2012-219718

(51) Int. Cl.
*H04L 27/00* (2006.01)
*H04B 1/26* (2006.01)

(52) U.S. Cl.
CPC ........................................ *H04B 1/26* (2013.01)

(58) Field of Classification Search
CPC ... H04L 1/0003; H04L 1/0071; H04L 5/0007; H04L 27/2647; H04L 27/12; H04L 27/10; H04L 27/06; H04L 27/063; H04L 7/033; H04L 7/0337; H04B 1/30; H04B 1/16
USPC ....................................................... 375/295
See application file for complete search history.

(56) References Cited

U.S. PATENT DOCUMENTS

| | | | |
|---|---|---|---|
| 5,890,051 A | * | 3/1999 | Schlang et al. ................. 455/76 |
| 5,937,335 A | * | 8/1999 | Park et al. ....................... 455/86 |
| 6,452,909 B1 | * | 9/2002 | Bauer ............................ 370/280 |
| 7,116,706 B2 | * | 10/2006 | Cook et al. .................... 375/219 |

OTHER PUBLICATIONS

Rola A. Baki et al., "RF CMOS Fully-Integrated Heterodyne Front-End Receivers Design Technique for 5 GHz Applications," Proceedings of the 2004 International Symposium on Circuits and Systems, 2004, pp. I-960-I-963.

Background Art Information (Concise Explanation of the Cite No. 14), Toshiba, Feb. 5, 2013.

\* cited by examiner

*Primary Examiner* — Ted Wang
(74) *Attorney, Agent, or Firm* — Knobbe, Martens, Olson & Bear LLP (57) ABSTRACT

According to some embodiments, there is provided a signal generating device, including a signal generator and a local signal generating unit. The signal generator generates a signal of a fixed frequency. The local signal generating unit generates, based on the signal of the fixed frequency, a first local signal to convert a frequency of a first signal, and a second local signal to convert a frequency of a second signal. The second signal is a signal resulting from that the first signal is subjected to frequency conversion based on the first local signal and has a frequency different from the first local signal.

13 Claims, 9 Drawing Sheets

| ch. | $m_i$ | $f_0/m_i$ [GHz] | AFTER SSB [GHz] | 1stLO [GHz] | IF [GHz] | RF [GHz] |
|---|---|---|---|---|---|---|
| 1 | 8 | 3.24 | 22.68 | 45.36 | 12.96 | 58.32 |
| 2 | 12 | 2.16 | 23.76 | 47.52 | 12.96 | 60.48 |
| 3 | 24 | 1.08 | 24.84 | 49.68 | 12.96 | 62.64 |
| 4 | – | – | 25.92 | 51.84 | 12.96 | 64.80 |

SIGNAL GENERATING DEVICE AND RADIO DEVICE

CROSS REFERENCE TO RELATED APPLICATIONS

This application is based upon and claims the benefit of priority from the prior Japanese Patent Application No. 2012-219718, filed on Oct. 1, 2012, the entire contents of which are incorporated herein by reference.

FIELD

Embodiments described herein relate to a signal generating device and a radio device.

BACKGROUND

There is a transceiver that performs frequency conversion twice in transmission or reception. In such a transceiver, a heterodyne system is widely used, which performs frequency conversion by using two oscillators that are an oscillator for high frequency and an oscillator for low frequency, respectively.

The above described transceiver needs to use the two oscillators that are an oscillator for high frequency and an oscillator for low frequency, and therefore, have the problem of increasing the circuit area and the problem of increasing the power consumption.

DETAILED DESCRIPTION

According to some embodiments, there is provided a signal generating device, including a signal generator and a local signal generating unit.

The signal generator generates a signal of a fixed frequency.

The local signal generating unit generates, based on the signal of the fixed frequency, a first local signal to convert a frequency of a first signal, and a second local signal to convert a frequency of a second signal. The second signal is a signal resulting from that the first signal is subjected to frequency conversion based on the first local signal, and has a frequency different from the first local signal.

Hereinafter, embodiments will be described in detail with reference to the drawings.

(First Embodiment)

Figure 1:
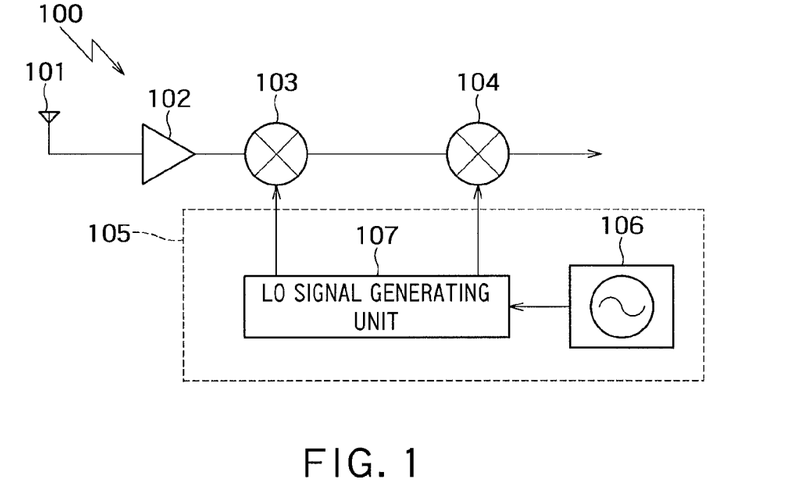
FIG. 1 is a block diagram of a receiver according to a first embodiment.

FIG. 1 is a block diagram of a receiver (radio device) according to the present embodiment.

A receiver 100 shown in FIG. 1 includes an antenna 101, an amplifier 102, a first frequency converter 103, a second frequency converter 104, and a local signal generating device 105. Further, the local signal generating device 105 includes a signal generator 106 and a local signal generating unit 107.

The signal generator 106 generates a signal of a fixed frequency. As the signal generator 106, a phase locked loop (PLL) including an oscillator, a crystal oscillator and the like can be used. The local signal generating unit 107 generates a first local signal for use in frequency conversion in the first frequency converter 103, and a second local signal for use in frequency conversion in the second frequency converter 104 by using the signal of the fixed frequency that is generated by the signal generator 106.

The antenna 101 receives a radio signal (RF signal) in the air. The RF signal received by the antenna 101 is amplified by the amplifier 102. The first frequency converter 103 subjects the signal amplified by the amplifier 102 to frequency conversion by the first local signal that is generated by the local signal generating device 105, and generates an intermediate frequency signal (IF signal). The second frequency converter 104 subjects the IF signal to frequency conversion by the second local signal that is generated by the local signal generating device 105, and generates a base band signal (BB signal).

The local signal generating unit 107 generates the first local signal and the second local signal by processing combining one or more of frequency division, frequency multiplication, multiplication and the like with use of the signal of the fixed frequency that is generated by the signal generator 106. Further, the local signal generating unit 107 generates the first local signal and the second local signal that respectively correspond to carrier frequencies of a plurality of channels by switching parameters of frequency division, frequency multiplication, multiplication and the like. Specific processing will be described in embodiments that will be described later.

As above, according to the present embodiment, two or more local signals can be generated with only one oscillator included in the signal generator 106. Therefore, an area of a transceiver which performs frequency conversion twice or more can be made small.

Further, when the signal generator 106 is realized by a PLL, the output frequency is fixed, and therefore, an operating frequency range of the oscillator can be narrowed. Since the operating frequency range is narrow, an L/C ratio can be enhanced when an LC type oscillator is used. Accordingly, the signal generator becomes low power consumption and the output signal of the signal generator becomes low phase noise.

Further, when the frequency of the first or the second local signal is switched in response to change of the carrier frequency, only the parameters of frequency division, frequency multiplication, multiplication and the like of the local signal generating unit 107 are changed, and the oscillation frequency of the oscillator is constant. Accordingly, frequency switching is not necessary, and a lockup time can be short.

Note that an image rejection filter may be interposed between the amplifier 102 and the first frequency converter 103. Further, a band pass filter may be interposed between the first frequency converter 103 and the second frequency converter 104. Further, in the first embodiment, the example in which the frequency conversion is performed twice is shown, but frequency conversion by three times or more can be similarly configured.

In the present embodiment, the example of applying the local signal generating device to the receiver is shown, and the local signal generating device is similarly applicable to a transmitter or a transceiver, as long as the radio device performs frequency conversion by twice or more (see FIG. 13 that will be described later).

(Second Embodiment)

Figure 2:
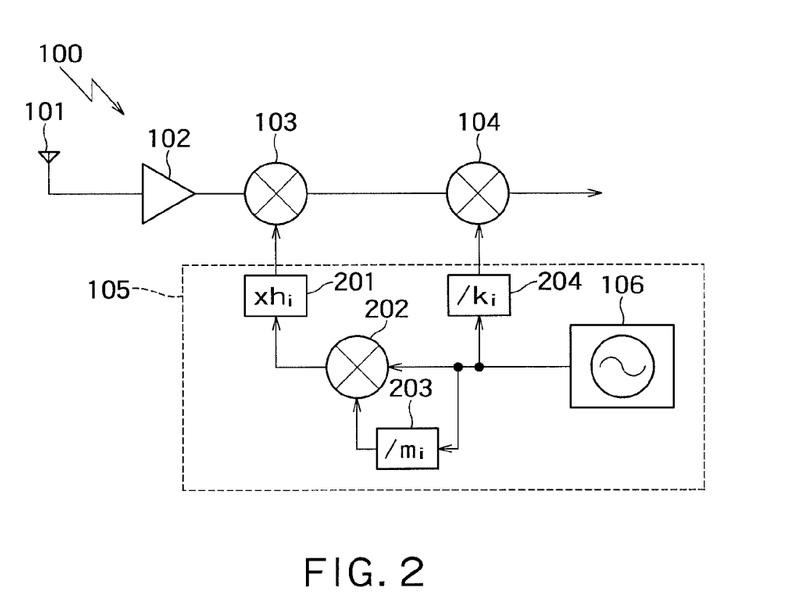
FIG. 2 is a block diagram of a receiver according to a second embodiment.

FIG. 2 is a block diagram of a receiver according to the present embodiment.

The receiver 100 shown in FIG. 2 includes the antenna 101, the amplifier 102, the first frequency converter 103, the second frequency converter 104, and the local signal generating device 105.

The configuration and the operation of those other than the local signal generating device 105 are similar to the embodiment 1, and therefore, only the local signal generating device 105 will be described hereinafter.

The local signal generating device 105 includes the signal generator 106 the output frequency of which is fixed, a frequency multiplier 201 with a frequency multiplying number "$h_i$", a mixer 202, a frequency divider 203 with a frequency dividing number "$m_i$", and a frequency divider 204 with a frequency dividing number "$k_i$".

The frequency divider 203 divides a frequency of a signal outputted from the signal generator 106 to be $1/m_i$, and generates a "$m_i$" frequency-divided signal. The multiplier 202 multiplies the signal outputted from the signal generator 106 and a "$m_i$" frequency-divided signal. The frequency multiplier 201 multiplies a frequency of the signal obtained by the multiplier 202 by "$h_i$", and generates a first local signal.

Further, the frequency divider 204 divides the frequency of the signal outputted from the signal generator 106 to be $1/\text{"}k_i\text{"}$, and generates a second local signal. Here, carrier frequencies of n kinds of channels expressed with i=1, 2, ... , n are expressed as "$f_i$".

The frequency multiplying number "$h_i$", the frequency dividing number "$m_i$", and the frequency dividing number "$k_i$" are set in accordance with the respective carrier frequencies to satisfy the following expression. A frequency "$f_0$" of the signal generator 106 is constant irrespective of the carrier frequency.

$$f_i = \{h_i(1 \pm 1/m_i) \pm 1/k_i\} f_0 \tag{1}$$

Some of the frequency multiplying number "$h_i$", the frequency dividing number "$m_i$", and the frequency dividing number "$k_i$" can be made fixed values irrespective of the carrier frequency. For example, the frequency multiplying number "$h_i$" and the frequency dividing number "$k_i$" may be respectively set as "h" and "k" that are fixed values. At this time, the frequency dividing number "$m_i$" is set in response to each carrier frequency so as to satisfy the following expression.

$$f_i = \{h(1 \pm 1/m_i) \pm 1/k\} f_0 \tag{2}$$

Note that the output signal of the signal generator 106 or the output signal of the frequency divider 203 may be directly inputted into the frequency multiplier 201, and the local signal corresponding to the carrier frequency "$f_i$" may be generated, without using the mixer 202.

Namely, $$f_i = \{h_i \pm 1/k_i\} f_0 \tag{3}$$

or $$f_i = \{h_i/m_i \pm 1/k_i\} f_0 \tag{4}$$

is satisfied.

As above, in the second embodiment, by switching the frequency multiplying number "$h_i$", the frequency dividing number "$m_i$" and the frequency dividing number "$k_i$", the first and the second local signals corresponding to each of a plurality of carrier frequencies can be generated from one fixed frequency signal.

As a modification example of the local signal generating device, a configuration in which the frequency divider is changed to the frequency multiplier, and the frequency multiplier is changed to the frequency divider is enabled. Namely, instead of the "$k_i$" frequency divider 204, a frequency multiplier of the frequency multiplying number "$k_i$" may be used, and instead of the "$h_i$" frequency multiplier 201, a frequency divider with the frequency dividing number "$h_i$" may be used.

In this case, instead of the above described expressions (1) to (4), the following expressions can be used.

$$f_i = \{1/h_i \cdot (1 \pm 1/m_i) \pm k_i\} f_0 \tag{1'}$$

$$f_i = \{1/h_i \cdot (1 \pm 1/m_i) \pm k\} f_0 \tag{2'}$$

$$f_i = \{1/h_i \pm k_i\} f_0 \tag{3'}$$

$$f_i = \{1/(h_i \cdot m_i) \pm k_i\} f_0 \tag{4'}$$

As another modification example, the frequency multiplier with the frequency multiplying number "$k_i$" may be used instead of the "$k_i$" frequency divider 204. In this case, instead of the above described expressions (1) to (4), the following expressions can be used.

$$f_i = \{h_i(1 \pm 1/m_i) \pm k_i\} f_0 \tag{1''}$$

$$f_i = \{h(1 \pm 1/m_i) \pm k\} f_0 \tag{2''}$$

$$f_i = \{h_i \pm k_i\} f_0 \tag{3''}$$

$$f_i = \{h_i/m_i \pm k_i\} f_0 \tag{4''}$$

As still another modification example, the frequency divider with the frequency dividing number "$h_i$" may be used instead of the "$h_i$" frequency multiplier 201. In this case, instead of the above described expressions (1) to (4), the following expressions can be used.

$$f_i = \{1/h_i(1 \pm 1/m_i) \pm 1/k_i\} f_0 \tag{1'''}$$

$$f_i = \{1/h(1 \pm 1/m_i) \pm 1/k\} f_0 \tag{2'''}$$

$$f_i = \{1/h_i \pm 1/k_i\} f_0 \tag{3'''}$$

$$f_i = \{1/h_i/m_i \pm 1/k_i\} f_0 \tag{4'''}$$

(Third Embodiment)

Figure 3:
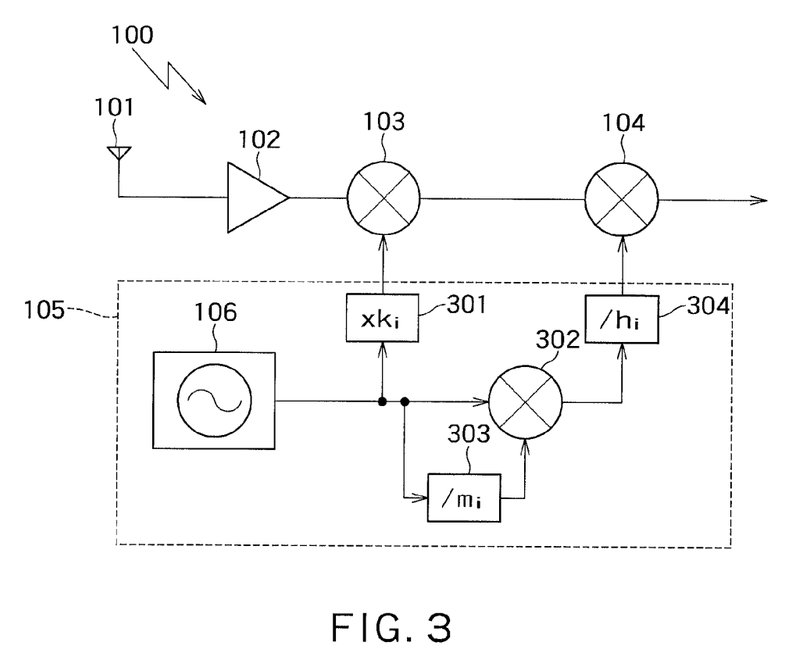
FIG. 3 is a block diagram of a receiver according to a third embodiment.

FIG. 3 is a block diagram of a receiver according to the present embodiment.

The receiver 100 shown in FIG. 3 includes the antenna 101, the amplifier 102, the first frequency converter 103, the second frequency converter 104, and the local signal generating device 105.

The configuration and the operation of those other than the local signal generating device 105 are similar to the first embodiment, and therefore, only the local signal generating device 105 will be described hereinafter.

The local signal generating device 105 includes the signal generator 106 the output frequency of which is fixed, a frequency multiplier 301, a mixer 302, a frequency divider 303 with a frequency dividing number "$m_i$", and a frequency divider 304 with a frequency dividing number "$h_i$".

The frequency multiplier 301 multiplies a frequency of the signal outputted from the signal generator 106 by "$k_i$", and thereby, generates a first local signal. The frequency divider 303 divides the frequency of the signal outputted from the signal generator 106 by "$m_i$", and thereby, generates an "$m_i$" frequency-divided signal. The multiplier 302 multiplies the signal outputted from the signal generator 106 and the "$m_i$" frequency-divided signal. The frequency divider 304 divides a frequency of the signal obtained by the multiplier 302 by "$h_i$", and thereby, generates a second local signal.

Here, carrier frequencies of "n" kinds of channels expressed with i=1, 2, . . . , n are expressed as "$f_i$". A frequency multiplying number "$k_i$", the frequency dividing number "$m_i$" and the frequency dividing number "$h_i$" are set in response to each carrier frequency so as to satisfy the following expression. Further, an output frequency "$f_0$" of the signal generator 106 is set as a fixed value, irrespective of the carrier frequency.

$$f_i = \{k_i \pm (1 \pm 1/m_i) \cdot 1/h_i\} f_0 \quad (5)$$

Further, some of the frequency multiplying number "$k_i$", the frequency dividing number "$m_i$" and the frequency dividing number "$h_i$" can be made fixed values irrespective of the carrier frequency. For example, the frequency multiplying number "$k_i$" and the frequency dividing number "$h_i$" may be respectively set as "h" and "k" that are fixed values. At this time, the frequency dividing number "$m_i$" is set in response to each carrier frequency so as to satisfy the following expression. Also, the frequency multiplying number "h", the frequency dividing number "k" and the frequency "$f_0$" are made fixed values irrespective of the carrier frequency.

$$f_i = \{k \pm (1 \pm 1/m_i) \cdot 1/h\} f_0 \quad (6)$$

Note that the output signal of the signal generator 106 or the output signal of the frequency divider 303 may be directly inputted into the frequency divider 304, and thereby a local signal corresponding to the carrier frequency "$f_i$" may be generated, without using the mixer 302, though not illustrated.

Namely, $$f_i = \{k_i \pm 1/h_i\} f_0 \quad (7)$$

or $$f_i = \{k_i \pm 1/m_i \cdot 1/h_i\} f_0 \quad (8)$$

is satisfied.

As above, in the third embodiment, by switching the frequency multiplying number "$k_i$", the frequency dividing number "$m_i$" and the frequency dividing number "$h_i$", the first and the second local signals corresponding to each of a plurality of carrier frequencies can be generated from one signal with a fixed frequency.

As a modification example of the local signal generating device shown in FIG. 3, a configuration in which the frequency divider is changed to the frequency multiplier, and the frequency multiplier is changed to the frequency divider can be also used. Namely, instead of the "$h_i$" frequency divider 304, a frequency multiplier with the frequency multiplying number "$h_i$" may be used, and instead of the "$k_i$" frequency multiplier 301, a frequency divider with the frequency dividing number "$k_i$" may be used. In this case, instead of the above described expressions (5) to (8), the following expressions can be used.

$$f_i = \{1/k_i \pm (1 \pm 1/m_i) \cdot h_i\} f_0 \quad (5)'$$

$$f_i = \{1/k \pm (1 \pm 1/m_i) \cdot h\} f_0 \quad (6)'$$

$$f_i = \{1/k_i \pm h_i\} f_0 \quad (7)'$$

$$f_i = \{1/k_i \pm 1/m_i \cdot h_i\} f_0 \quad (8)'$$

As another modification example, the frequency multiplier with the frequency multiplying number "$h_i$" may be used instead of the "$h_i$" frequency divider 304. In this case, instead of the above described expressions (5) to (8), the following expressions can be used.

$$f_i = \{k_i \pm (1 \pm 1/m_i) \cdot h_i\} f_0 \quad (5)''$$

$$f_i = \{k \pm (1 \pm 1/m_i) \cdot h\} f_0 \quad (6)''$$

$$f_i = \{k_i \pm h_i\} f_0 \quad (7)''$$

$$f_i = \{k_i \pm 1/m_i \cdot h_i\} f_0 \quad (8)''$$

As still another modification example, the frequency divider with the frequency dividing number "$k_i$" may be used instead of the "$k_i$" frequency multiplier 301. In this case, instead of the above described expressions (5) to (8), the following expressions can be used.

$$f_i = \{1/k_i \pm (1 \pm 1/m_i) \cdot 1/h_i\} f_0 \quad (5)'''$$

$$f_i = \{1/k \pm (1 \pm 1/m_i) \cdot 1/h\} f_0 \quad (6)'''$$

$$f_i = \{1/k_i \pm 1/h_i\} f_0 \quad (7)'''$$

$$f_i = \{1/k_i \pm 1/m_i \cdot 1/h_i\} f_0 \quad (8)'''$$

Expressions (1) to (4), (1)' to (4)', (1)" to (4)" and (1)''' to (4)''' described in the second embodiment, and expressions (5) to (8), (5)' to (8)', (5)" to (8)" and (5)''' to (8)''' described in the present embodiment can be summarized and expressed by the following expressions (A), (B) and (C). In order to satisfy any expression of the following (A), (B) and (C), "$h_i$", "$k_i$", "$m_i$" and "$f_0$" are determined.

$$f_i = |h_i^{\pm 1}(1 \pm 1/m_i) \pm k_i^{\pm 1}| \cdot f_0 \quad (A)$$

$$f_i = |h_i^{\pm 1} \pm k_i^{\pm 1}| \cdot f_0 \quad (B)$$

$$f_i = |h_i^{\pm 1} \cdot 1/m_i \pm k_i^{\pm 1}| \cdot f_0 \quad (C)$$

(Fourth Embodiment)

Figure 4:
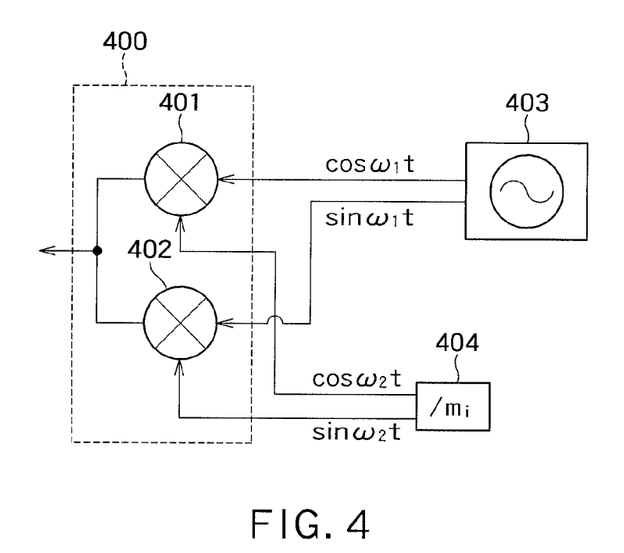
FIG. 4 is a block diagram showing examples of a multiplying unit and a peripheral unit thereof according to a fourth embodiment.

FIG. 4 is a block diagram showing a configuration example of a multiplying unit and a peripheral unit thereof according to the present embodiment.

A multiplying unit 400 shown in FIG. 4 is a single side band multiplier including a first multiplier 401 and a second multiplier 402.

A signal generator 403 outputs a first orthogonal signal cos ω1t and sin ω1t. cos ω1t corresponds to an in-phase component signal (I signal), sin ω1t corresponds to a quadrature component signal (Q signal), and these signals are in an orthogonal (differing in phase by 90 degrees) relationship to each other. The cos ω1t signal is inputted in the first multiplier 401, and the sin ω1t signal is inputted in the second multiplier 402. A generation method of the orthogonal signal may be optional. A fixed frequency signal is inputted in an orthogonal signal generating unit, and an orthogonal signal may be generated. Further, as will be described later, there are cited a method of generating an orthogonal signal from a differential signal by an orthogonal signal generating unit (see 505 in FIG. 5) such as a polyphase filter, a method of generating an orthogonal signal by an oscillator that oscillates at a desired even-numbered order harmonic frequency and an even-number frequency divider (see 1005 and 1007 in FIG. 10), and a method of generating an orthogonal signal by a quadrature oscillator (QO) 907 (907 in FIG. 9). As the orthogonal signal generating unit, for example, a phase shifter, a frequency divider and the like can be used.

A frequency divider 404 outputs a second orthogonal signal $\cos \omega 2t$ and $\sin \omega 2t$. The frequency divider with a frequency dividing number being an even number can directly obtain an orthogonal signal by using a D flip-flop configuration (frequency divider configured by connecting a plurality of D flip-flops). The signal which is entered as input at this time may be a fixed frequency signal of, for example, a frequency "$\omega 1$", or one of the above described $\cos \omega 1t$ and $\sin \omega 1t$ may be entered as input. Note that an orthogonal signal generating unit is disposed at a post stage of the frequency divider 404, and a second orthogonal signal may be generated in the orthogonal signal generating unit from a signal of a frequency "$\omega 2$" after being subjected to frequency division. The $\cos \omega 2t$ signal is inputted in the first multiplier 401, and the $\sin \omega 2t$ signal is inputted in the second multiplier 402.

The single side band multiplier 400 generates a single side band $\omega 1 - \omega 2$ or $\omega 1 + \omega 2$ signal by the relational expressions expressed as follows by using the first orthogonal signal $\cos \omega 1t$ and $\sin \omega 1t$, and the second orthogonal signal $\cos \omega 2t$ and $\sin \omega 2t$, and outputs the single side band $\omega 1 - \omega 2$ or $\omega 1 + \omega 2$ signal.

$$\cos \omega 1t \cdot \cos \omega 2t + \sin \omega 1t \cdot \sin \omega 2t = \cos(\omega 1 - \omega 2)t \quad (9\text{-}1)$$

$$\cos \omega 1t \cdot \cos \omega 2t - \sin \omega 1t \cdot \sin \omega 2t = \cos(\omega 1 + \omega 2)t \quad (9\text{-}2)$$

Namely, $\cos \omega 1t$ and $\cos \omega 2t$ are multiplied with the first multiplier 401, $\sin \omega 1t$ and $\sin \omega 2t$ are multiplied with the second multiplier 402, and these multiplied result signals are synthesized (added or subtracted). Thereby, the single side band signal of expression 9-1 or expression 9-2 is obtained.

As above, in the fourth embodiment, unwanted signals that are generated by multiplication can be suppressed by using the single side band multiplier.

Note that in order to suppress unwanted signals more, a filter may be used at a post stage of the single side band multiplier.

(Fifth Embodiment)

Figure 5:
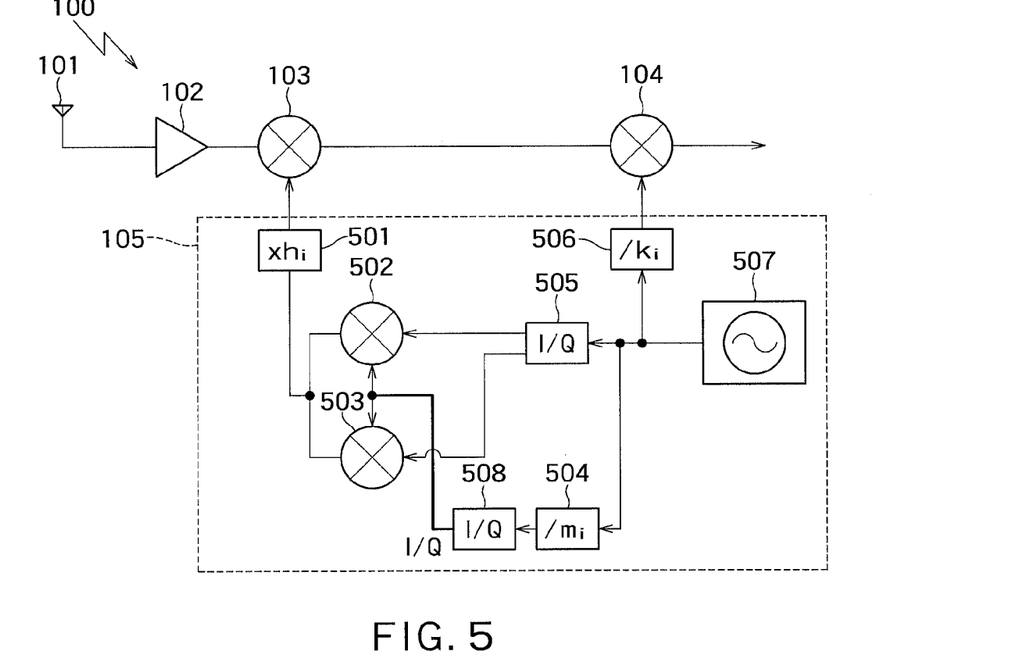
FIG. 5 is a block diagram of a receiver according to a fifth embodiment.

FIG. 5 is a block diagram of a receiver according to the present embodiment.

The receiver 100 shown in FIG. 5 includes the antenna 101, the amplifier 102, the first frequency converter 103, the second frequency converter 104, and the local signal generating device 105.

The configuration and the operation of those other than the local signal generating device 105 are similar to the first embodiment, and therefore, only the local signal generating device 105 will be described hereinafter.

The local signal generating device 105 includes a frequency multiplier 501 with a frequency multiplying number "$h_i$", mixers 502 and 503, a frequency divider 504 with a frequency dividing number "$m_i$", a first orthogonal signal generating unit (first phase sifter) 505 that generates an orthogonal signal, a frequency divider 506 with a frequency dividing number "$k_i$", a signal generator 507 that generates a signal of a fixed frequency, and a second orthogonal signal generating unit (second phase shifter) 508 that generates an orthogonal signal. For the orthogonal signal generating units 505 and 508, for example, polyphase filters can be used.

The first orthogonal signal generating unit 505 generates a first orthogonal signal from the signal of the fixed frequency outputted from the signal generator 507.

The frequency divider 504 divides a frequency of the signal of the fixed frequency outputted from the signal generator 507 by "$m_i$", and generates a "$m_i$" frequency-divided signal.

The second orthogonal signal generating unit 508 generates a second orthogonal signal from the "$m_i$" frequency-divided signal.

A single side band multiplier including the mixers 502 and 503 obtains a single side band signal from the first orthogonal signal and the aforementioned second orthogonal signal. The processing is as described in the fourth embodiment (FIG. 4).

The frequency multiplier 501 multiplies a frequency of the signal obtained by the single side band multiplier by "$h_i$", and generates a first local signal.

The frequency divider 506 divides a frequency of the signal of the fixed frequency outputted from the signal generator 507 to be $1/\text{"}k_i\text{"}$, and generates a second local signal.

As above, in the fifth embodiment, by using the single side band multiplier, unwanted signals generated by multiplication can be suppressed.

Further, an operation frequency required by the phase shifter 505 is limited to only one frequency. Therefore, design becomes easy, and the phase shifter with high precision can be realized. Note that when "$m_i$" is fixed to one value, a similar effect can be also obtained for the phase shifter 508.

Further, when all the frequency dividing numbers "$m_i$" can be realized by even numbers, a D flip-flop configuration is used as the frequency divider 504, for example, and thereby frequency division and orthogonal signal generation can be realized simultaneously. In this case, the orthogonal signal generating unit 508 can be made unnecessary.

Note that, in order to suppress unwanted signals more, a filter may be used at a post stage of the single side band multiplier.

(Sixth Embodiment)

Figure 6:
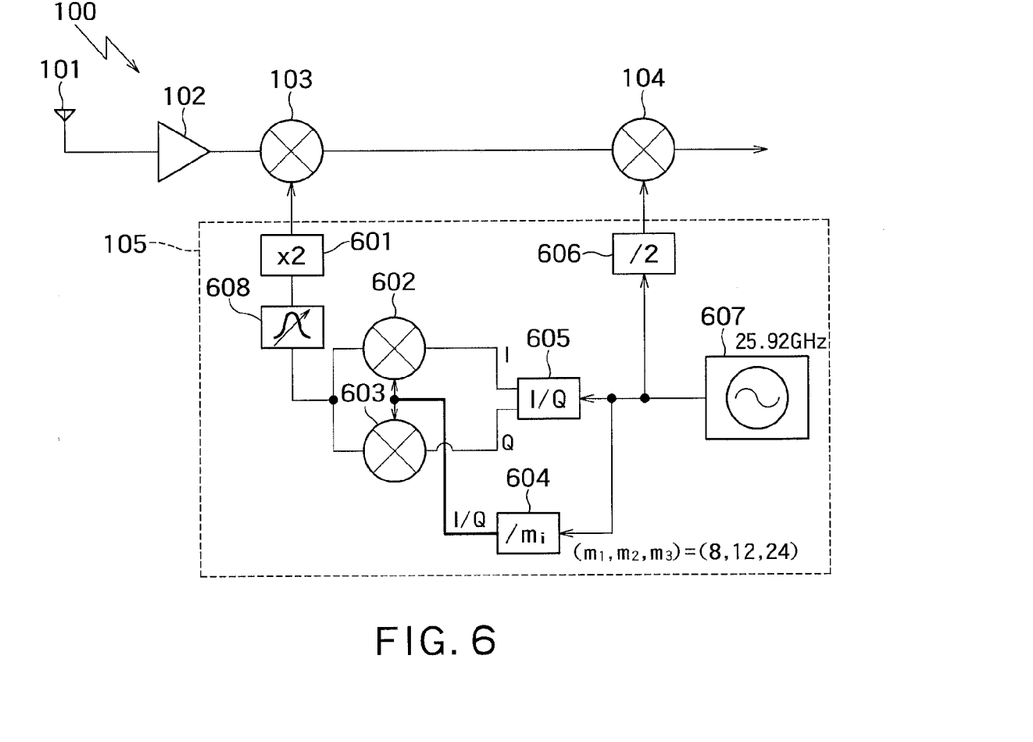
FIG. 6 is a block diagram of a receiver according to a sixth embodiment.

FIG. 6 is a block diagram of a receiver according to the present embodiment.

The receiver 100 shown in FIG. 6 includes the antenna 101, the amplifier 102, the first frequency converter 103, the second frequency converter 104, and the local signal generating device 105.

The configuration and the operation of those other than the local signal generating device 105 are similar to the first embodiment, and therefore, only the local signal generating device 105 will be described hereinafter.

The local signal generating device 105 includes a frequency multiplier 601, mixers 602 and 603, a frequency divider 604, a phase shifter 605, a frequency divider 606, a signal generator 607 and a band pass filter 608.

The present local signal generating device is configured for carrier frequencies 58.32 GHz (channel 1), 60.48 GHz (channel 2), 62.64 GHz (channel 3) and 64.80 GHz (channel 4) that are used in a millimeter wave band such as IEEE802.11ad and WiGig. More specifically, parameters are set as follows.

A frequency multiplying number of the frequency multiplier 601 is two.

A frequency dividing number "$m_i$" of the frequency divider 604 is 8(="$m_1$"), 12(="$m_2$") and 24(="$m_3$"), and the frequency dividing number is switched in response to the channels.

An output frequency of the signal generator 607 is fixed to 25.92 GHz.

A frequency dividing number of the frequency divider 606 is two.

The band pass filter 608 is a filter in which a pass band is variable in response to the channel to suppress unwanted signals.

For the orthogonal signal generating unit 605 that generates an orthogonal signal, for example, a polyphase filter can be used, and an operating frequency thereof is 25.92 GHz as described above.

The orthogonal signal generating unit 605 generates a first orthogonal signal from a signal of a fixed frequency that is outputted from the signal generator 607.

The frequency divider 604 is a circuit that divides the signal of the fixed frequency that is outputted from the signal generator 607 by "$m_i$". Since the frequency dividing number "$m_i$" is an even number, the frequency divider 604 can be configured by using, for example, a D flip-flop. Thereby, an orthogonal signal can be obtained simultaneously with frequency division. More specifically, the frequency divider 604 simultaneously performs generation of a frequency-divided signal obtained by dividing the frequency of the fixed frequency signal by "$m_i$", and generation of a second orthogonal signal (an I signal and a Q signal) having the same frequency as the frequency-divided signal. In this configuration, an orthogonal signal generating unit is not necessary at a post stage of the frequency divider 604.

The frequency dividing number "$m_i$" of the frequency divider 604 is set to 8, 12 and 24 with respect to the channels 1, 2 and 3, respectively. Accordingly, the frequency divider 604 generates the second orthogonal signal of the frequencies corresponding to the respective channels. It can be performed by change of a switch or the like the second orthogonal signal corresponding to which value of the respective values of "mi" is to be outputted (see FIG. 7 that will be described later). Further, in the case of the cannel 4, a signal of 25.92 GHz is inputted in the band pass filter 608 without performing single side band multiplication. This can be realized, for example, by inputting 1 instead of the I signal, and inputting 0 instead of the Q signal from the frequency divider 604 into the mixers 602 and 603 (see explanation of FIG. 7 that will be described later).

The single side band multiplier including the mixers 602 and 603 generates a single side band signal (signal of the aforementioned expression 12-1 or expression 12-2) from the first orthogonal signal and the second orthogonal signal, and outputs the single side band signal to the band pass filter 608. The band pass filter 608 suppresses unwanted signals (harmonics and the like) included in the single side band signal.

The frequency multiplier 601 multiplies the frequency of the single side band signal from which the unwanted signals are suppressed in the band pass filter 608 by two, and thereby generates a first local signal.

The frequency divider 606 divides the signal of the fixed frequency outputted from the signal generator 607 into two, and thereby, generates a second local signal.

Figure 14:
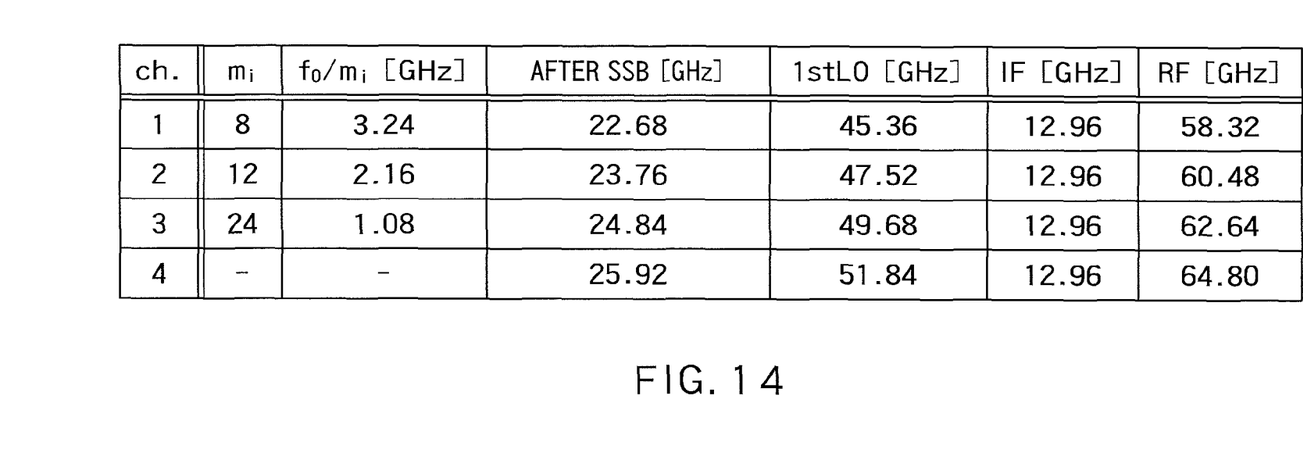
FIG. 14 is a diagram showing one example of a relationship of a frequency dividing number, a frequency after frequency division, a frequency after single side band multiplication, a frequency of a first local signal, an intermediate frequency, and a carrier frequency in each channel.

FIG. 14 shows one example of a relationship of the frequency dividing number "$m_i$", a frequency ("$f_0$"/"$m_i$") after frequency division, a frequency after single side band (SSB) multiplication, a frequency of the first local signal, an IF frequency, and a carrier frequency in each of the channels as Table 1.

As above, in the sixth embodiment, the first and the second local signals for the four carrier frequencies for use in the millimeter wave band communication can be generated.

Note that if the unwanted signals which are generated by the single side band multiplier are small, the band pass filter 608 may be eliminated.

(Seventh Embodiment)

Figure 7:
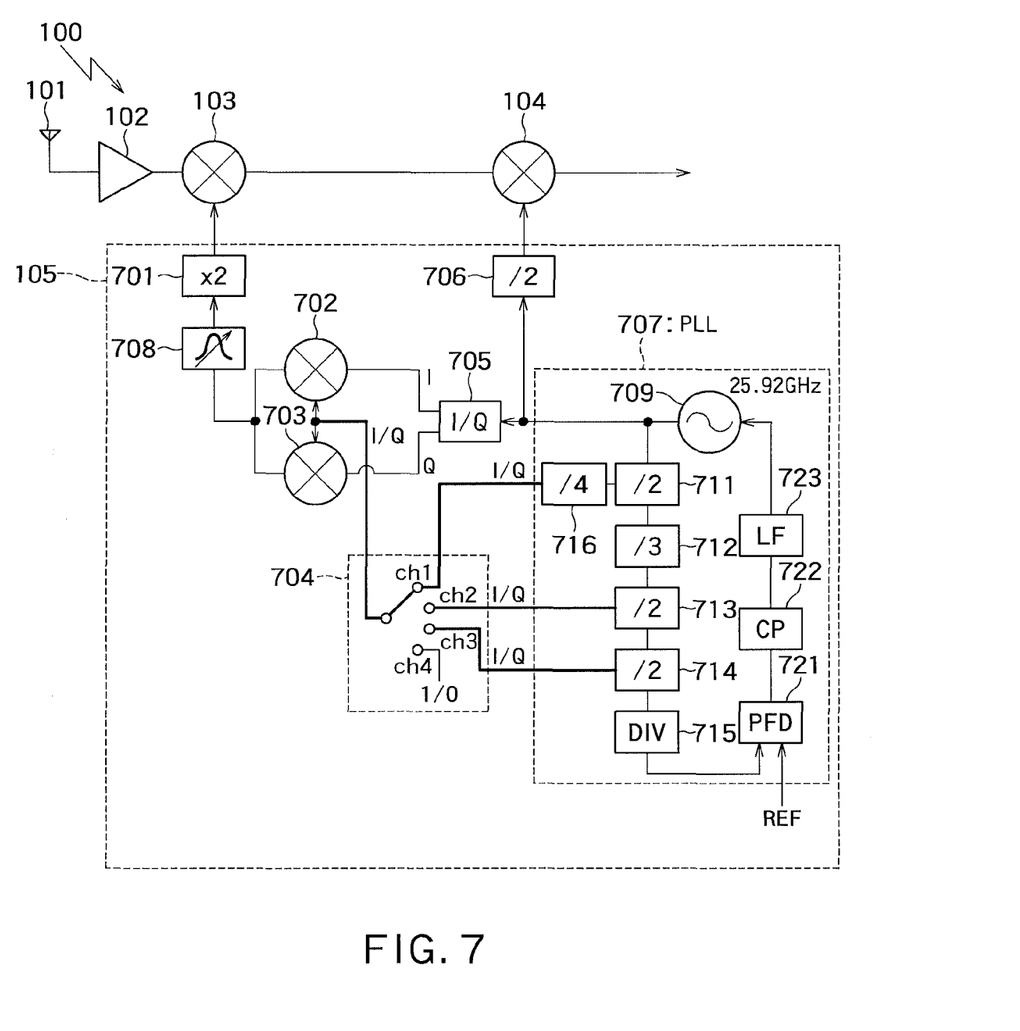
FIG. 7 is a block diagram of a receiver according to a seventh embodiment.

FIG. 7 is a block diagram of a receiver according to the present embodiment.

The receiver 100 shown in FIG. 7 includes the antenna 101, the amplifier 102, the first frequency converter 103, the second frequency converter 104, and the local signal generating device 105.

The local signal generating device 105 includes a frequency doubler 701, mixers 702 and 703, a signal switching unit 704, a phase shifter 705, a ½ frequency divider 706, a signal generator 707, and a band pass filter 708 with a variable pass band. The present local signal generating device 105 generates first and second local signals for the carrier frequencies 58.32 GHz, 60.48 GHz, 62.64 GHz and 64.80 GHz for use in the millimeter wave band similarly to the sixth embodiment.

The configuration and the operation of those other than the signal switching unit 704 and the signal generator 707 in the local signal generating device 105 are similar to the sixth embodiment, and therefore, only the signal switching unit 704 and the signal generator 707 will be described hereinafter.

The signal generator 707 is a phase-locked loop (PLL), and generates frequency-divided signals of the frequency dividing numbers of 8, 12 and 24 described in the sixth embodiment.

The signal generator 707 includes a voltage controlled oscillator (VCO) 709, a ½ frequency dividing circuit 711, a ⅓ frequency dividing circuit 712, a ½ frequency dividing circuit 713, a ½ frequency dividing circuit 714, a frequency dividing circuit 715 having a frequency dividing number of an optional value, a ¼ frequency dividing circuit 716, a phase frequency comparator (PFD) 721, a charge pump (CP) 722 and a loop filter (LF) 723.

The voltage controlled oscillator (VCO) generates a signal of an oscillation frequency close to 25.92 GHz.

The PFD 721 outputs a pulse corresponding to a phase difference from the signal outputted from the frequency dividing circuit 715, at each period of a reference signal REF. The CP 722 generates a current signal and gives the current signal to the LF 723 during the pulse outputted from the PFD 721. The LF 723 smoothes the current signal and generates a control voltage to be given to the VCO 709. The VCO 709 generates a signal of a frequency corresponding to the controlled voltage.

The signal generated by the VCO 709 is directly inputted in the phase shifter 705 and is inputted in the ½ frequency dividing circuit 711.

The ½ frequency dividing circuit 711 divides a frequency of the signal which is inputted from the VCO 709 by two.

The ¼ frequency dividing circuit 716 generates a frequency-divided signal of a frequency dividing number 8 by dividing the frequency of the signal after going through ½ frequency division by four, and simultaneously outputs an orthogonal signal having the same frequency as the frequency-divided signal to the signal switching unit 704. The ¼ frequency dividing circuit 716 has, for example, a D flip-flop configuration. The an orthogonal signal correspond to the second orthogonal signal for channel 1.

The ⅓ frequency dividing circuit 712 divides the frequency of the signal after going through the above described ½ frequency division by three, and thereby generates a frequency-divided signal of a frequency dividing number 6.

The ½ frequency dividing circuit 713 generates a frequency-divided signal of a frequency dividing number 12 by dividing the frequency-divided signal of the frequency dividing number 6 by two, and simultaneously, outputs an orthogonal signal having the same frequency as the frequency-divided signal to the signal switching unit 704. The orthogonal signal correspond to a second orthogonal signal for channel 2.

The ½ frequency dividing circuit 714 generates a frequency-divided signal of a frequency dividing number of 24 by dividing the frequency-divided signal of the frequency dividing number 12 by two, and simultaneously, outputs an orthogonal signal having the same frequency as the frequency-divided signal to the signal switching unit 704. The orthogonal signal correspond to a second orthogonal signal for channel 3.

The frequency dividing circuit 715 divides the 24 frequency-divided signal by an optional value, and outputs the 24 frequency-divided signal to the PFD 721.

By the above operation, the PLL 707 outputs the signal of the frequency fixed to 25.92 GHz.

The signal switching unit 704 selects the second orthogonal signal corresponding to the channel for use, out of channels 1 to 4. In the case of channel 1, the connecting destination is switched to the ¼ frequency dividing circuit 716, in the case of channel 2, the connecting destination is switched to the ½ frequency dividing circuit 713, and in the case of channel 3, the connecting destination is switched to the ½ frequency dividing circuit 714. In the case of channel 4, signals of 1 and 0 given from an outside are selected. The signal of 1 is inputted in the mixer 702, and the signal of 0 is inputted in the mixer 703.

As above, in the seventh embodiment, the four carrier frequencies for use in millimeter wave band communication can be generated.

Further, the frequency dividing numbers 8, 12 and 24 described in the sixth embodiment can be realized by the PLL, and the frequency divider with the frequency dividing number "$m_i$" ("$m_i$"=8, 12, 24) becomes unnecessary.

Note that if the unwanted signals generated by the single side band multiplier are small, the band pass filter 708 may be eliminated.

(Eighth Embodiment)

Figure 8:
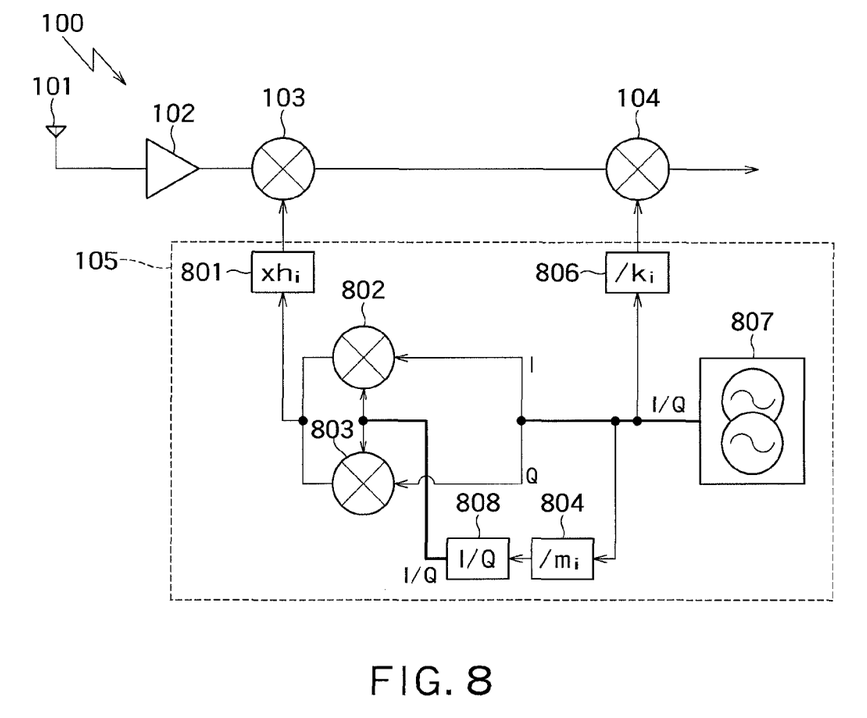
FIG. 8 is a block diagram of a receiver according to an eighth embodiment.

FIG. 8 is a block diagram of a receiver according to the present embodiment.

The receiver 100 shown in FIG. 8 includes the antenna 101, the amplifier 102, the first frequency converter 103, the second frequency converter 104, and the local signal generating device 105.

The configuration and the operation of those other than the local signal generating device 105 are similar to the first embodiment, and therefore, only the local signal generating device 105 will be described hereinafter.

The local signal generating device 105 includes a signal generator 807, a frequency multiplier 801 with a frequency multiplying number "$h_i$", mixers 802 and 803, a frequency divider 804 with a frequency dividing number "$m_i$", a frequency divider 806 with a frequency dividing number "$k_i$", and an orthogonal signal generating unit 808.

The signal generator 807 outputs a first orthogonal signal. For example, an IQ orthogonal signal may be simultaneously outputted with one oscillator. Alternatively, two oscillators that oscillate at the same frequency are included, and a circuit which oscillates them with a phase difference of 90 degrees being kept by connecting them by a certain circuit, for example, a quadrature oscillator (QO) may be adopted.

The frequency divider 804 divides a frequency of one of the I signal and the Q signal which form the first orthogonal signal by the frequency dividing number "$m_i$".

The orthogonal signal generating unit 808 generates a second orthogonal signal based on the "$m_i$" frequency-divided signal. When the frequency dividing number "$m_i$" is an even number, the orthogonal signal generating unit 808 can be omitted by using a frequency divider by a D flip-flop.

A single side band multiplier including the mixers 802 and 803 obtains a single side band signal by performing single side band multiplication based on the aforementioned first orthogonal signal and the aforementioned second orthogonal signal.

The frequency multiplier 801 generates a first local signal by multiplying a frequency of the single side band signal by "$h_i$".

The frequency divider 806 generates a second local signal by dividing a frequency of one of I and Q components of the first orthogonal signal outputted from the signal generator 807 by "$k_i$".

As above, in the eighth embodiment, the first orthogonal signal are directly obtained by the signal generator 807, and therefore, an orthogonal signal generating unit for generating the first orthogonal signal becomes unnecessary.

Further, by using the single side band multiplier, unwanted signals generated by multiplication can be suppressed.

Note that in order to suppress unwanted signals more, a filter may be provided at a post stage of the single side band multiplier.

(Ninth Embodiment)

Figure 9:
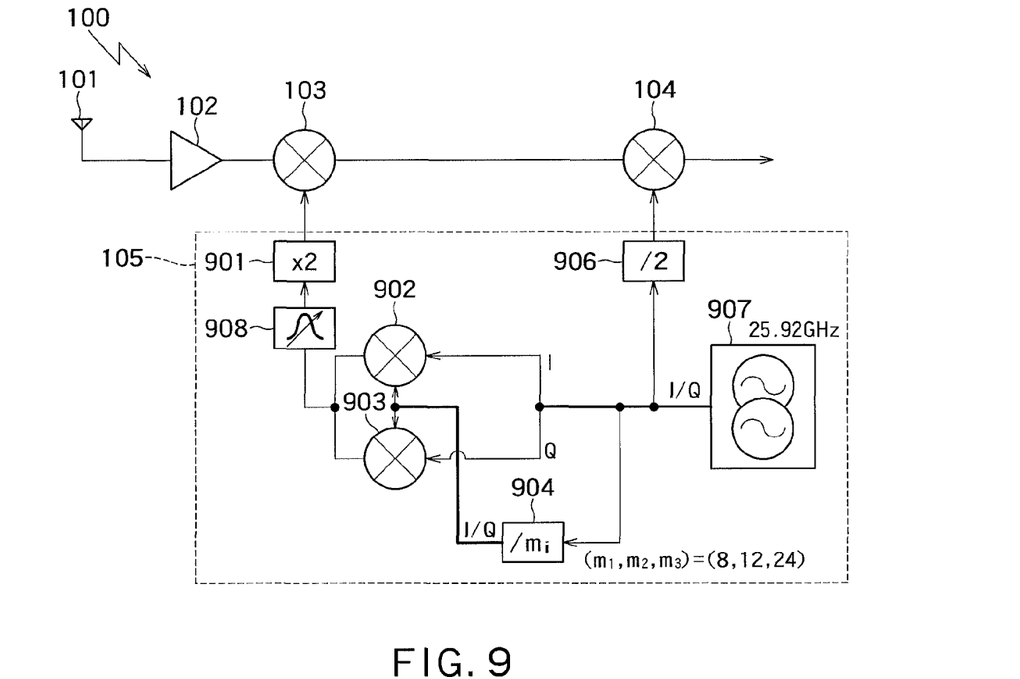
FIG. 9 is a block diagram of a receiver according to a ninth embodiment.

FIG. 9 is a block diagram of a receiver according to the present embodiment.

The receiver 100 shown in FIG. 9 includes the antenna 101, the amplifier 102, the first frequency converter 103, the second frequency converter 104, and the local signal generating device 105.

The configuration and the operation of those other than the local signal generating device 105 are similar to the first embodiment, and therefore, only the local signal generating device 105 will be described hereinafter.

The local signal generating device 105 includes a frequency doubler 901, mixers 902 and 903, a frequency divider 904, a ½ frequency divider 906, a signal generator 907 and a band pass filter 908. In the band pass filter 908, a pass band is variable in response to the channel to suppress unwanted signals.

The present local signal generating device generates first and second local signals for the carrier frequencies 58.32 GHz, 60.48 GHz, 62.64 GHz and 64.80 Hz for use in the millimeter wave band such as IEEE802.11ad and WiGig.

The signal generator 907 outputs a first orthogonal signal of an output frequency of 25.92 GHz.

The frequency divider 904 divides a frequency of one of the I signal and the Q signal which form the first orthogonal signal by a frequency dividing number "$m_i$" ($m_1$; $m_2$; $m_3$=8, 12, 24) to generate an "$m_i$" frequency-divided signal, and outputs a second orthogonal signal. The frequency dividing number "$m_i$" of the frequency divider 904 is set to 8, 12, and 24 in response to channels 1, 2 and 3. For the channel 4, single side band multiplication is not performed, and a signal of 25.92 GHz can be inputted in the band pass filter 908.

The single side band multiplier including the mixers 902 and 903 performs single side band multiplication based on the first orthogonal signal and the second orthogonal signal, and obtains a single side band signal. The single side band signal is inputted in the band pass filter 908.

The band pass filter 908 changes a pass band in response to the channel in use.

The frequency multiplier 901 doubles a frequency of the single side band signal which passes through the band pass filter 908, and thereby generates the first local signal.

The frequency divider 906 divides by two the frequency of one of the I signal and the Q signal which form the first orthogonal signal outputted from the signal generator 907, and thereby generates the second local signal.

Table 1 of FIG. 14 shows one example of the relationship of the frequency dividing number "$m_i$", the frequency after frequency division, the frequency after single side band multiplication, the frequency of the first local signal, the IF frequency, and the carrier frequency in each of the channels.

As above, in the ninth embodiment, the four carrier frequencies for use in millimeter wave band communication can be generated.

Further, since the frequency dividing number "$m_i$" is an even number, frequency division and orthogonal signal generation can be simultaneously realized by using a frequency divider by a D flip-flop, for example, as the frequency divider 906. Accordingly, an orthogonal signal generating unit is not necessary at a post stage of the frequency divider 904.

Note that if unwanted signals generated by the single side band multiplier are small, the band pass filter 908 may be eliminated.

(Tenth Embodiment)

Figure 10:
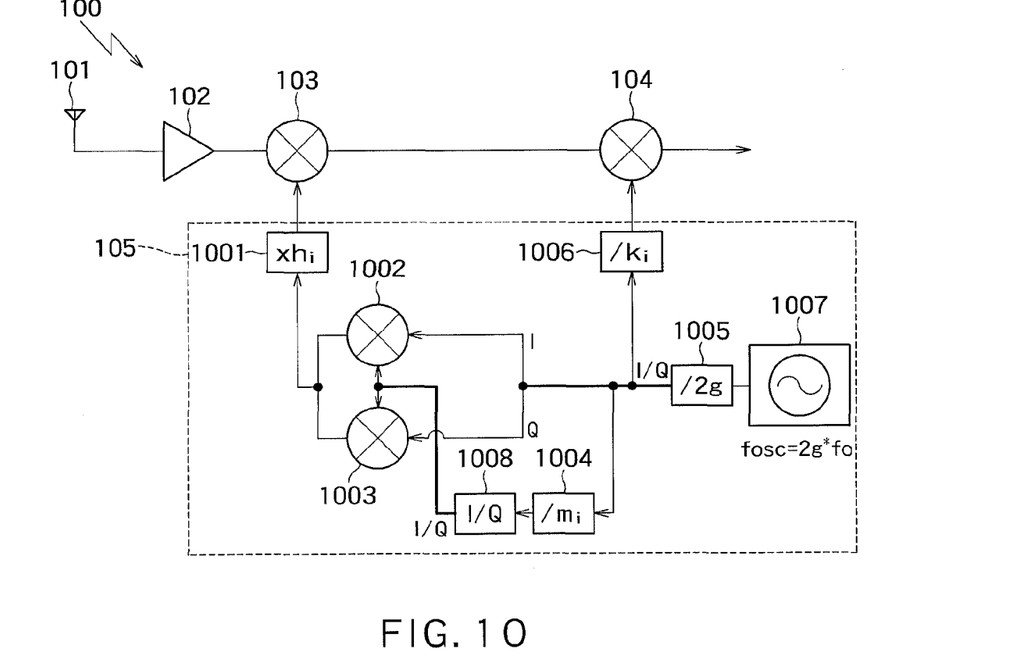
FIG. 10 is a block diagram of a receiver according to a tenth embodiment.

FIG. 10 is a block diagram of a receiver according to the present embodiment.

The receiver 100 shown in FIG. 10 includes the antenna 101, the amplifier 102, the first frequency converter 103, the second frequency converter 104, and the local signal generating device 105.

The configuration and the operation of those other than the local signal generating device 105 are similar to the first embodiment, and therefore, only the local signal generating device 105 will be described hereinafter.

The local signal generating device 105 includes a frequency multiplier 1001, mixers 1002 and 1003, a frequency divider 1004, a frequency divider 1005 with a frequency dividing number "2g" ("g" is an integer of 1 or larger), a frequency divider 1006, a signal generator 1007 and an orthogonal signal generating unit 1008.

The signal generator 1007 generates a signal having a fixed output frequency "$f_{osc}$" (=2g·$f_0$).

The frequency divider 1005 divides a frequency of the signal generated in the signal generator 1007 by the frequency dividing number "2g", and thereby, outputs a first orthogonal signal of a frequency "$f_0$". Since "2g" is an even number, the first orthogonal signal can be directly obtained from the frequency divider 1005 by using the frequency divider by the D flip-flop or the like. In the present embodiment, the output frequency of the frequency divider 1005 is considered to correspond to $f_0$ in the aforementioned expressions (1) to (8), (1)' to (8)', (1)" to (8)", (1)''' to (8)''', (A), (B) and (C).

The frequency divider 1004 divides a frequency of one of the I signal and the Q signal which form the first orthogonal signal by "$m_i$", and outputs the frequency-divided signal to the orthogonal signal generating unit 1008.

The orthogonal signal generating unit 1008 generates a second orthogonal signal based on the frequency-divided signal from the frequency divider 1004. When the frequency dividing number "$m_i$" is an even number, the orthogonal signal generating unit 1008 can be omitted by using a frequency divider of a D flip-flop configuration.

The single side band multiplier including the mixers 1002 and 1003 obtains a single side band signal from the first orthogonal signal and the aforementioned second orthogonal signal.

The frequency multiplier 1001 multiplies a frequency of the single side band signal by "$h_i$", and thereby, generates a first local signal.

The frequency divider 1006 divides by "$k_i$" the frequency of one of the I signal and the Q signal which form the first orthogonal signal outputted from the frequency divider 1005, and thereby generates a second local signal.

As above, in the tenth embodiment, unwanted signals generated by multiplication can be suppressed by using the single side band multiplier.

Further, the first orthogonal signal can be obtained by the frequency divider 1005, and an orthogonal signal generator (phase sifter) for generating the first orthogonal signal becomes unnecessary.

Further, when all the frequency dividing numbers "$m_i$" can be realized by even numbers, frequency division and orthogonal signal generation can be simultaneously realized by using the frequency divider by a D flip-flop, for example, as the frequency divider 1004. In this case, the orthogonal signal generating unit 1008 becomes unnecessary.

Note that in order to suppress unwanted signals more, a filter may be used at a post stage of the single side band multiplier.

(Eleventh Embodiment)

Figure 11:
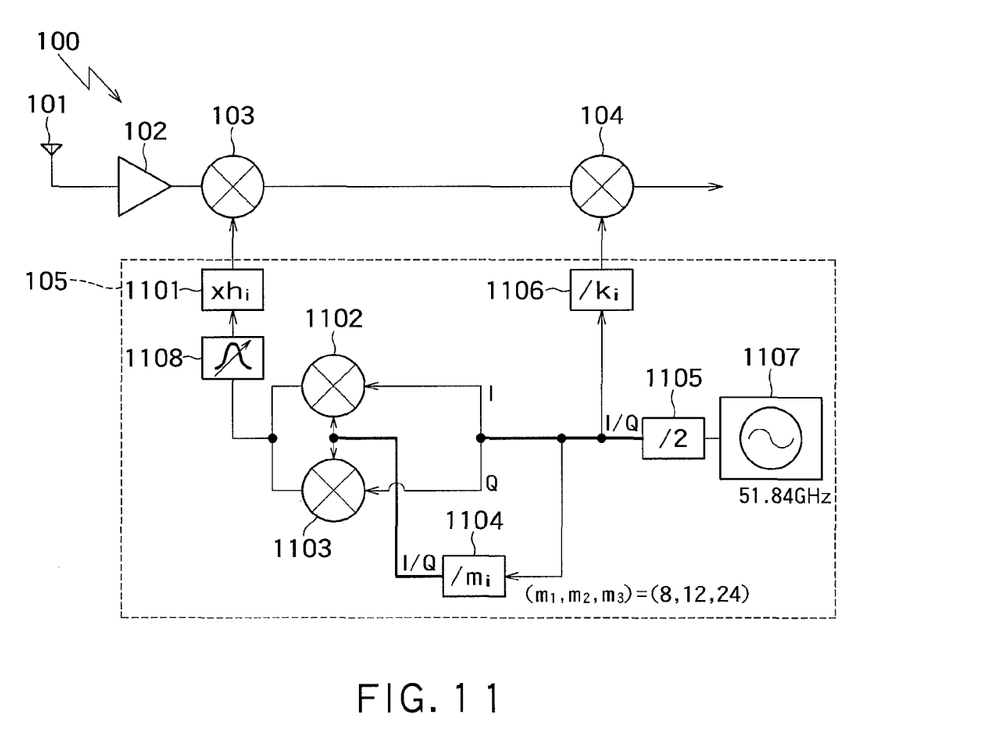
FIG. 11 is a block diagram of a receiver according to an eleventh embodiment.

FIG. 11 is a block diagram of a receiver according to the present embodiment.

The receiver 100 shown in FIG. 11 includes the antenna 101, the amplifier 102, the first frequency converter 103, the second frequency converter 104, and the local signal generating device 105.

The operation of those other than the local signal generating device 105 is similar to the first embodiment, and therefore, only the local signal generating device 105 will be described hereinafter.

The local signal generating device 105 includes a frequency doubler 1101, mixers 1102 and 1103, a frequency divider 1104 with frequency dividing numbers "$m_i$" being 8, 12 and 24, a ½ frequency divider 1105, a ½ frequency divider 1106, a signal generator 1107 and a band pass filter 1108.

The present local signal generating device outputs first and second local signals for the carrier frequencies 58.32 GHz, 60.48 GHz, 62.64 GHz and 64.80 GHz for use in the millimeter wave band such as IEEE802.11ad and WiGig.

The signal generator 1107 generates a signal of an output frequency of 51.84 GHz.

The ½ frequency divider 1105 divides the signal generated in the signal generator 1107 by two, and outputs a first orthogonal signal.

A frequency of one of the I signal and the Q signal which form the first orthogonal signal is divided by "$m_i$" by the "$m_i$" frequency divider 1104, and a second orthogonal signal are generated. The frequency dividing number "$m_i$" of the frequency divider 1104 is set at 8, 12 and 24 in response to channels 1, 2 and 3. The second orthogonal signal corresponding to "$m_i$" corresponding to the channel in use are outputted. Note that for the channel 4, single side band multiplication is not performed, and a signal of 25.92 GHz is inputted in the band pass filter 1108, as described above.

The single side band multiplier including the mixers 1102 and 1103 performs single side band multiplication based on the first orthogonal signal and the second orthogonal signal, and obtains a single side band signal.

The band pass filter 1108 changes a pass band in response to the channel in use.

The frequency doubler 1101 doubles a frequency of the single side band signal that passes through the band pass filter, and generates a first local signal.

The ½ frequency divider 1106 divides a frequency of the signal outputted from the signal generator 1107 by two, and generates a second local signal.

One example of the relationship of the frequency dividing number "$m_i$", the frequency after frequency division, the frequency after single side band multiplication, the frequency of the first local signal, the IF frequency and the carrier frequency in each channel is as in Table 1 of FIG. 14.

As above, in the eleventh embodiment, the four carrier frequencies which are used in millimeter wave band communication can be generated.

Further, since the frequency dividing numbers of the frequency divider 1105 and the frequency divider 1104 are even numbers, frequency division and the orthogonal signal generation can be simultaneously realized by using a frequency divider by a D flip-flop, for example. An orthogonal signal generating unit becomes unnecessary at post stages of the frequency divider 1105 and the frequency divider 1104.

Note that if the unwanted signals generated by the single side band multiplier are small, the band pass filter 1108 may be eliminated.

(Twelfth Embodiment)

Figure 12:
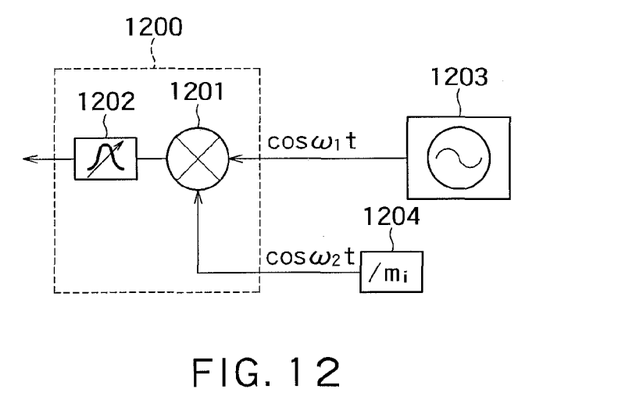
FIG. 12 is a block diagram of a multiplying unit and a peripheral unit thereof according to a twelfth embodiment.

FIG. 12 is a block diagram of a multiplying unit and a peripheral unit thereof according to the present embodiment.

A multiplying unit 1200 shown in FIG. 12 includes a multiplier 1201, and a band pass filter 1202 in which a band is variable in response to a channel.

A signal generator 1203 generates a first signal cos $\omega 1t$, and inputs the first signal cos $\omega 1t$ in the multiplier 1201. The signal generator 1203 may be an oscillator of a fixed frequency.

A frequency divider 1204 divides a frequency of an input signal by "$m_i$", and generates a second signal cos $\omega 2t$. The input signal may be optional. For example, the above described first signal cos $\omega 1t$ may be entered as an input. The frequency divider 1204 inputs the generated second signal cos $\omega 2t$ in the multiplier 1201.

Hereinafter, an operation of the multiplying unit 1200 will be described.

The multiplier 1200 uses the first signal cos $\omega 1t$ and the second signal cos $\omega 2t$, and outputs signals $\omega 1+\omega 2$ and $\omega 1-\omega 2$ of both side wave bands (an upper wave band and an lower wave band) by a relational expression expressed as follows.

$$\cos \omega 1t \cdot \cos \omega 2t = \{\cos(\omega 1+\omega 2)t + \cos(\omega 1-\omega 2)t\}/2 \quad \text{expression (10)}$$

Further, besides the upper wave band signal and the lower wave band signal, harmonic components are present in some cases due to circuit nonlinearity or the like.

For the signals including various frequency components as described above, signals of desired frequencies are passed, and signals of the other frequencies are suppressed by using the band pass filter 1202 in which the band is variable in response to the channel. The signal of the desired frequency is, for example, the upper wave band signal (or the lower wave band signal), and at this time, the signal of the frequency to be suppressed is the lower wave band signal (or the upper wave band signal) and signals of harmonic components.

As above, in the twelfth embodiment, the local signals corresponding to a plurality of carrier frequencies can be generated by using the band pass filter 1202 in which the band is variable in response to the channel.

Further, unlike the multiplying unit of embodiment 4 (FIG. 4), the single side band multiplier, and the orthogonal signal generating unit become unnecessary in the present embodiment.

(Thirteenth Embodiment)

Figure 13:
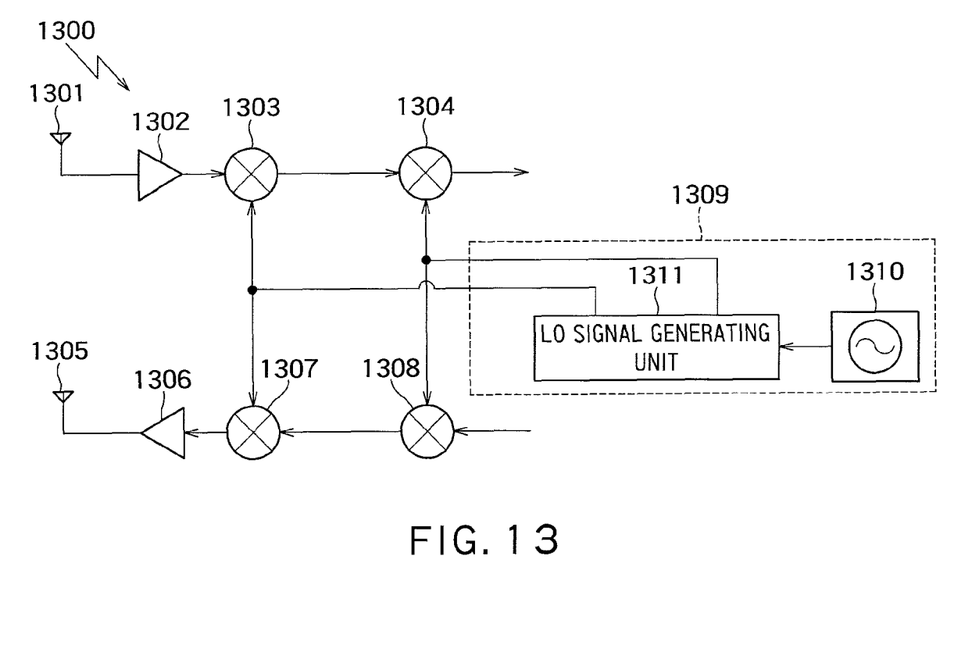
FIG. 13 is a block diagram of a radio device according to a thirteenth embodiment.

FIG. 13 is a block diagram of a transceiver (radio device) according to the present embodiment.

A transceiver 1300 shown in FIG. 13 includes a receiving antenna 1301, a receiving amplifier 1302, a first receiving frequency converter 1303, a second receiving frequency converter 1304, a transmitting antenna 1305, a transmitting amplifier 1306, a first transmitting frequency converter 1307, a second transmitting frequency converter 1308, and a local signal generating device 1309. The local signal generating device 1309 includes a signal generator 1310 that generates a signal of a fixed frequency, and a local signal generating unit 1311.

The local signal generating device 1309 is the local signal generating device according the first to the twelfth embodiments, and outputs local signals corresponding to the carrier frequencies of a plurality of channels. The local signal generating device 1309 outputs a first and a second local signals for reception, and a first and a second local signals for transmission. The receiving first local signal and the transmitting first local signal are the same, and the receiving second local signal and the transmitting second local signal are the same.

A radio signal received by the receiving antenna 1301 is amplified in the receiving amplifier 1302, and thereafter is inputted in the first receiving frequency converter 1303.

The first receiving frequency converter 1303 performs frequency conversion of the signal from the amplifier 1302 by the receiving first local signal generated by the local signal generating device 1309, to make a reception intermediate frequency signal.

The second receiving frequency converter 1304 performs frequency conversion of the reception intermediate frequency signal by the receiving second local signal generated by the local signal generating device 1309, and thereby obtains a reception base band signal.

Further, the second transmitting frequency converter 1308 performs frequency conversion of a transmission base band signal by the transmitting second local signal generated by the local signal generating device 1309, to make a transmission intermediate frequency signal.

The first transmitting frequency converter 1307 performs frequency conversion of the transmission intermediate frequency signal by the transmitting first local signal generated from the local signal generating device 1309 to make a radio frequency signal.

The transmitting amplifier 1306 amplifies the radio frequency band signal, and transmits the ratio frequency band signal as a radio signal from the transmitting antenna 1305.

As above, in the thirteenth embodiment, the radio device is configured with use of the local signal generating device according to the first to the twelfth embodiments, and thereby the radio device corresponding to a plurality of channels can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A signal generating device, comprising:
a signal generator to generate a signal of a fixed frequency with a use of one oscillator; and
a local signal generator to generate, without any oscillator, based on the signal of the fixed frequency, a first local signal to convert a frequency of a first signal, and a second local signal to convert a frequency of a second signal, the second signal resulting from that the first signal is subjected to frequency conversion based on the first local signal and having a frequency different from the first local signal, wherein the local signal generator includes
at least a first frequency divider or a first frequency multiplier out of
the first frequency divider with a frequency dividing number of "$h_i$" or "$k_i$",
the first frequency multiplier with a frequency multiplying number of "$k_i$" or "$h_i$", and
a second frequency divider with a frequency dividing number of "$m_i$",
"$h_i$", "$k_i$", "$m_i$" and "$f_0$" are determined to satisfy any one of expressions:

$$f_i = |h_i^{\pm 1}(1 \pm 1/m_i) \pm k_i^{\pm 1}| \cdot f_0 \quad (A)$$

$$f_i = |h_i^{\pm 1} \pm k_i^{\pm 1}| \cdot f_0 \quad (B) \text{ and}$$

$$f_i = |h_i^{\pm 1} \cdot 1/m_i \pm k_i^{\pm 1}| \cdot f_0 \quad (C),$$

"$f_i$" expresses a carrier frequency of a used channel i, and "$f_0$" expresses the fixed frequency.

2. The device according to claim 1, further comprising:
a multiplying unit to multiply the signal of the fixed frequency by an "$m_i$" frequency-divided signal obtained by the second frequency divider to obtain a multiplied signal,
wherein the first frequency multiplier with the frequency multiplying number "$h_i$" multiplies a frequency of the multiplied signal by "$h_i$", and the first frequency divider with the frequency dividing number "$k_i$" divides a frequency of the signal of the fixed frequency by "$k_i$" to thereby generate different ones of the first and the second local signals respectively,
or
the first frequency divider with the frequency dividing number "$h_i$" divides the frequency of the multiplied signal by "$h_i$", and the first frequency multiplier with the frequency multiplying number "$k_i$" multiplies the frequency of the signal of the fixed frequency by "$k_i$" to thereby generate different ones of the first and the second local signals respectively,
or
the first frequency multiplier with the frequency multiplying number "$h_i$" multiplies the frequency of the multiplied signal by "$h_i$", and the first frequency multiplier with the frequency multiplying number "$k_i$" multiplies the frequency of the signal of the fixed frequency by "$k_i$" to thereby generate different ones of the first and the second local signals respectively,
the first frequency divider with the frequency dividing number "$h_i$" divides the frequency of the multiplied signal by "$h_i$", and the first frequency divider with the frequency dividing number "$k_i$" divides the frequency of the signal of the fixed frequency by "$k_i$" to thereby generate different ones of the first and the second local signals respectively,
or
the first frequency multiplier with the frequency multiplying number "$k_i$" multiplies the frequency of the signal of the fixed frequency by "$k_i$", and the first frequency divider with the frequency dividing number "$h_i$" divides the frequency of the multiplied signal by "$h_i$" to thereby generate different ones of the first and the second local signals respectively,
or
the first frequency divider with the frequency dividing number "$k_i$" divides the frequency of the signal of the fixed frequency by "$k_i$", and the first frequency multiplier with the frequency multiplying number "$h_i$" multiplies the frequency of the multiplied signal by "$h_i$" to thereby generate different ones of the first and the second local signals respectively,
or
the first frequency multiplier with the frequency multiplying number "$k_i$" multiplies the frequency of the signal of the fixed frequency by "$k_i$", and the first frequency multiplier with the frequency multiplying number "$h_i$" multiplies the frequency of the multiplied signal by "$h_i$" to thereby generate different ones of the first and the second local signals respectively,
or
the first frequency divider with the frequency dividing number "$k_i$" divides the frequency of the signal of the fixed frequency by "$k_i$", and the first frequency divider with the frequency dividing number "$h_i$" divides the frequency of the multiplied signal by "$h_i$" to thereby generate different ones of the first and the second local signals respectively.

3. The device according to claim 2, comprising:
a first unit to generate a first orthogonal signal having the fixed frequency; and
a second unit to generate a second orthogonal signal having a same frequency as a frequency obtained by "$m_i$" frequency division by the second frequency divider,
wherein the multiplying unit generates a single side band signal as the multiplied signal by performing single side band multiplication based on the first orthogonal signal and the second orthogonal signal.

4. The device according to claim 3,
wherein the first unit is a first orthogonal signal generating unit that generates the first orthogonal signal based on the signal of the fixed frequency, and
the second unit is a second orthogonal signal generating unit that generates the second orthogonal signal based on the "$m_i$" frequency-divided signal.

5. The device according to claim 4,
wherein the fixed frequency is 25.92 GHz,
the frequency dividing number of the first frequency divider is 2,
the frequency multiplying number of the first frequency multiplier is 2, and
the frequency dividing number "$m_i$" is 8, 12, or 24.

6. The device according to claim 3,
wherein the signal generator generates the first orthogonal signal as the signal of the fixed frequency,
the first frequency divider divides a frequency of one of an in-phase component and a quadrature component of the first orthogonal signal by "$k_i$", and thereby generates one of the first and the second local signals,
the second frequency divider divides a frequency of one or the other of the in-phase component and the quadrature component of the first orthogonal signal by "$m_i$", and thereby generates the "$m_i$" frequency-divided signal, and
the first frequency multiplier frequency multiplies a frequency of the single side band signal by "$h_i$", and thereby generates the other one of the first and the second local signals.

7. The device according to claim 6,
wherein a frequency of the first orthogonal signal is 25.92 GHz,
the frequency multiplying number "$h_i$" is 2, the frequency dividing number "$k_i$" is 2, and
the frequency dividing number "$m_i$" is 8, 12 or 24.

8. The device according to claim 3,
wherein the first unit is a third frequency divider that performs frequency division with a frequency dividing number "2g" ("g" is an integer of 1 or larger), the third frequency divider divides the frequency of the signal of the fixed frequency by the frequency dividing number "2g", and generates the first orthogonal signal having the same frequency as a frequency after the frequency division by the "2g", the second frequency divider divides a frequency of one or the other of an in-phase component and a quadrature component of the first orthogonal signal by the frequency dividing number "$m_i$", and thereby generates the "$m_i$" frequency-divided signal, the first frequency multiplier multiplies the frequency of the single side band signal by "$h_i$", and thereby generates one of the first and the second local signals, and the first frequency divider divides a frequency of one of the in-phase component and the quadrature component of the first orthogonal signal by "$k_i$", and thereby generates the other one of the first and the second local signals.

9. The device according to claim 8,
wherein the fixed frequency is 51.84 GHz,
the "g" is 1,
the frequency multiplying number "$h_i$" is 2,
the frequency dividing number "$k_i$" is 2, and
the frequency dividing number "$m_i$" is 8, 12 or 24.

10. The device according to claim 2,
wherein the multiplying unit includes a multiplier and a band pass filter, the multiplier multiplying the signal of the fixed frequency by the "$m_i$" frequency-divided signal to obtain a multiplied signal and the band pass filter filtering the multiplied signal, and the multiplying unit changes a pass band of the band pass filter in response to the used channel.

11. The device according to claim 1,
wherein the first signal is a reception signal from a destination radio device, or a transmission signal to the destination radio device.

12. A radio device, comprising:
an antenna;
the signal generating device according to claim 1;
a first reception frequency converting unit to obtain the second signal by performing frequency conversion of the first signal that is a signal received by the antenna, based on the first local signal; and
a second reception frequency converting unit to perform frequency conversion of the second signal, based on the second local signal.

13. A radio device, comprising:
the signal generating device according to claim 1;
a first transmission frequency converting unit to obtain the second signal by performing frequency conversion of a transmission signal being the first signal, based on the first local signal;
a second transmission frequency converting unit to perform frequency conversion of the second signal, based on the second local signal; and
an antenna to transmit a signal converted by the second frequency converting unit.

* * * * *